United States Patent
Tsumura

(10) Patent No.: US 8,669,156 B2
(45) Date of Patent: Mar. 11, 2014

(54) METHOD OF MANUFACTURING SEMICONDUCTOR CIRCUIT DEVICE

(75) Inventor: Kazuhiro Tsumura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 106 days.

(21) Appl. No.: 13/046,098

(22) Filed: Mar. 11, 2011

(65) Prior Publication Data
US 2011/0223730 A1  Sep. 15, 2011

(30) Foreign Application Priority Data

Mar. 15, 2010  (JP) ................................ 2010-058446

(51) Int. Cl.
H01L 21/8242 (2006.01)

(52) U.S. Cl.
USPC ..... 438/239; 438/200; 438/303; 257/E21.647

(58) Field of Classification Search
USPC ......... 438/199, 200, 250, 231, 238, 239, 301, 438/303
See application file for complete search history.

(56) References Cited

U.S. PATENT DOCUMENTS

| | | | |
|---|---|---|---|
| 5,356,826 A | | 10/1994 | Natsume |
| 5,429,981 A | * | 7/1995 | Gardner et al. ............... 438/394 |
| 5,714,410 A | * | 2/1998 | Kim ............................... 438/199 |
| 6,156,602 A | * | 12/2000 | Shao et al. .................... 438/238 |
| 6,200,846 B1 | * | 3/2001 | Watanabe ...................... 438/239 |
| 7,795,100 B2 | * | 9/2010 | Ema et al. ...................... 438/301 |
| 2006/0022274 A1 | * | 2/2006 | Hasegawa et al. ............. 257/358 |
| 2010/0038692 A1 | * | 2/2010 | Chuang et al. ................ 257/298 |
| 2010/0308397 A1 | * | 12/2010 | Ariyoshi ....................... 257/324 |
| 2011/0092035 A1 | * | 4/2011 | Hu et al. ........................ 438/250 |
| 2012/0228686 A1 | * | 9/2012 | Inoue et al. ................... 257/296 |

FOREIGN PATENT DOCUMENTS

| | | | |
|---|---|---|---|
| JP | 06-061423 A | | 3/1994 |
| JP | 09-289289 A | | 11/1997 |
| JP | 2705476 B2 | | 1/1998 |
| JP | 2967265 B2 | | 10/1999 |

* cited by examiner

Primary Examiner — Savitr Mulpuri
(74) Attorney, Agent, or Firm — Brinks Gilson & Lione

(57) ABSTRACT

Provided is a method of manufacturing a semiconductor circuit device including a MOS transistor and a capacitor element in which a gate electrode of a MOS transistor is formed of a first polysilicon film, a capacitor is formed of the first polysilicon film, a capacitor film, and a second polysilicon film, reduction in resistance of a normally-off transistor and reduction in resistance of a lower electrode of the capacitor are simultaneously performed, and reduction in resistance of an N-type MOS transistor and reduction in resistance of an upper electrode of the capacitor are simultaneously performed.

6 Claims, 6 Drawing Sheets

METHOD OF MANUFACTURING SEMICONDUCTOR CIRCUIT DEVICE

RELATED APPLICATIONS

This application claims priority under 35 U.S.C. §119 to Japanese Patent Application No. 2010-058446 filed on Mar. 15, 2010, the entire content of which is hereby incorporated by reference.

BACKGROUND OF THE INVENTION

1. Field of the Invention

The present invention relates to a method of manufacturing a semiconductor circuit device including a metal oxide semiconductor (MOS) transistor and a polysilicon capacitor element.

2. Description of the Related Art

The following two methods have been mainly employed to manufacture a semiconductor circuit device formed on a semiconductor substrate and including at least a MOS transistor and a capacitor element as basic elements.

In method A, a semiconductor substrate is used as a lower electrode and a polysilicon film is used as an upper electrode. In this case, the polysilicon film serving as the upper electrode is provided in common with a gate electrode of the MOS transistor, and a capacitor film (insulator or dielectric body sandwiched between two conductors) is provided in common with a gate insulating film. Accordingly, with addition of few steps, a capacitor element may be added to a semiconductor circuit device including a MOS transistor.

In method B, polysilicon films are used as both of the lower and upper electrodes. In this case, one of the lower and upper electrodes is provided in common with the electrode of the MOS transistor. However, addition of the capacitor element to the semiconductor circuit device including the MOS transistor creates a need to add a step of forming a capacitor film and one of the polysilicon films.

In the method B the number of steps is increased compared to the method A. Instead, there are such merits that the fixation of the potential of the lower electrode to that of the semiconductor substrate, and the generation of a large junction capacitance due to electrical separation from the semiconductor substrate with the use of a PN junction can be avoided. Further, there are such other merits that the capacitor film may be set independently from the gate insulating film of the MOS transistor, and an occupied area may be overwhelmingly reduced by laminating a capacitor element on the capacitor element formed in the method A.

In some cases addition of a resistor element to the semiconductor circuit device is necessary and the resistor element is formed of a polysilicon film different from that of the gate electrode (for example, see Japanese Patent No. 2967265). In those cases, application of the polysilicon film used in the resistor element as one electrode of the capacitor element enables addition of the capacitor element of the method B with few additional steps. As described above, in view of the merits and the number of steps, a more suitable manufacturing method for the semiconductor circuit device is selected.

As for a semiconductor device including a MOS transistor, a resistor element, and a capacitor element, an invention aimed for reduction of the number of steps and improvement of its characteristics has been disclosed (for example, see Japanese Patent No. 2705476).

First, problems exemplified in Japanese Patent No. 2967265 are described with reference to FIG. 3. A semiconductor circuit device illustrated in FIG. 3 includes a MOS transistor and a polysilicon resistor film 103. The MOS transistor includes a gate electrode formed of a first polysilicon film 102, and source/drain (S/D) regions 108. The polysilicon resistor film 103 is a film formed in a step different from a step of forming the polysilicon film 102 which forms the gate electrode. Accordingly those two polysilicon films can be used to form a polysilicon capacitor element. In this case, a step of forming a photomask and implanting impurities for reduction in resistance of a contact region of the polysilicon resistor film 103 may be provided in common with a step of implanting high concentration impurities for formation of the gate electrode and the S/D regions of the MOS transistor. Further, a step for reduction in resistance for the upper electrode of the capacitor element formed of the two polysilicon films may be provided in common therewith. However, it is necessary to add a step for photomask formation and a step for high concentration impurity implantation, which is dedicated for reduction in resistance of the lower electrode of the capacitor element. This addition of steps is a problem. The addition of steps increases manufacturing cost inevitably.

Next, problems exemplified in Japanese Patent No. 2705476 are described with reference to FIG. 4. A semiconductor device illustrated in FIG. 4 includes a MOS transistor, a polysilicon resistor film 103, and a polysilicon capacitor element. The MOS transistor includes a gate electrode formed of a first polysilicon film 102 and a refractory material 111, S/D regions 108, and LDD regions 109. The polysilicon resistor film 103 is formed of a polysilicon film which is formed simultaneously with the first polysilicon film 102. The polysilicon capacitor element includes a lower electrode 103a of a polysilicon capacitor, which is formed of the first polysilicon film 102, an upper electrode 103b of the polysilicon capacitor, which is formed of the refractory material 111, and a capacitor film 107. This semiconductor device has a feature in that a single polysilicon layer may be used to form the MOS transistor, the resistor film, and the capacitor element. Accordingly the manufacturing steps can be simplified by the step of forming the second polysilicon film. However, considering the number of steps for impurity implantation, it is necessary to additionally perform high concentration impurity implantation twice for forming an N-type gate electrode and a P-type gate electrode of the MOS transistors between the step of forming the polysilicon film and the step of forming the refractory material. The number of steps may be reduced by performing impurity implantation of the lower electrode of the capacitor element in common with the above-mentioned high concentration impurity implantation, by performing impurity implantation of the resistor element in common therewith, or, in a case where high resistance is necessary, by implanting low concentration impurities into the entire surface and then overwriting implantation of high concentration impurities. However, even in this case, at least two times of high concentration impurity implantation are necessary. Further, aside from this, in order to form the S/D regions, at least two times of high concentration impurity implantation are necessary. In other words, in total, at least four times of high concentration impurity implantation steps are necessary. As described above, more than the benefits of step simplification by providing the polysilicon film in common, the increase of the number of steps becomes a problem. The increase of the number of steps also causes the increase of the manufacturing cost.

Further, an LDD structure having side walls are generally used to construct a MOS transistor. However, when the MOS transistor having the LDD structure is used as a normally-off transistor for electrostatic discharge protection, it is known that electrostatic discharge protection capability is deteriorated compared to the case of using a so-called conventional type MOS transistor without the LDD structure. Then it is necessary to increase the size of the transistor when the MOS transistor having the LDD structure is used as the normally-off transistor for electrostatic discharge protection. Here, requirement of additional steps in order to form the conventional type MOS transistor prevents usage of the conventional type MOS transistor which can be reduced in size, which has been a problem.

SUMMARY OF THE INVENTION

The present invention has been made in view of the above-mentioned increase of the number of manufacturing steps. In order to solve the above-mentioned problem, in a method of manufacturing a semiconductor circuit device including a MOS transistor and a capacitor element according to the present invention, the following measure is adopted.

A method of manufacturing a semiconductor circuit device includes at least:

(a) forming a gate insulating film;
(b) forming a first polysilicon film on the gate insulating film;
(c) patterning the first polysilicon film to form a lower electrode of a capacitor element and a gate electrode of a MOS transistor;
(d) implanting high concentration N-type impurities ($5 \times 10^{14}$ ions/cm$^2$ to $2 \times 10^{16}$ ions/cm$^2$);
(e) forming a capacitor film;
(f) forming a second polysilicon film on the capacitor film;
(g) patterning the second polysilicon film to form an upper electrode of the capacitor element;
(h) implanting high concentration N-type impurities ($5 \times 10^{14}$ ions/cm$^2$ to $2 \times 10^{16}$ ions/cm$^2$); and
(i) implanting high concentration P-type impurities ($5 \times 10^{14}$ ions/cm$^2$ to $2 \times 10^{16}$ ions/cm$^2$), in which:

the gate electrode of the MOS transistor is formed of the first polysilicon film;

the capacitor element is formed of the first polysilicon film, the capacitor film formed in the step (e), and the second polysilicon film;

in the step (c), reduction in resistance of a gate electrode and source and drain regions of an N-type normally-off transistor, which is used as an electrostatic discharge protection circuit of the semiconductor circuit device, is performed simultaneously with reduction in resistance of the lower electrode of the capacitor element; and in the step (h), reduction in resistance of a gate electrode and source and drain regions of an N-type MOS transistor, which is an active element, is performed simultaneously with reduction in resistance of the upper electrode of the capacitor element. Thus the MOS transistor and the capacitor element are formed.

When a capacitor element, which includes the first polysilicon film and the second polysilicon film sandwiching the capacitor film, is added to the semi-conductor circuit device in which the second polysilicon film is used as the resistor element and provided separately from the first polysilicon film used for the gate electrode of the MOS transistor, low resistance of the lower electrode of the capacitor element can be achieved without adding a dedicated step of implanting high concentration impurities for low resistance of the lower electrode thereof.

In the steps of manufacturing a semiconductor circuit device including the capacitor element, which includes the first polysilicon film and the second polysilicon film sandwiching the capacitor film, and the MOS transistor having the LDD structure, it is possible to manufacture a conventional-type MOS transistor on the same semiconductor circuit device without adding a dedicated step.

DETAILED DESCRIPTION OF THE PREFERRED EMBODIMENTS

Figure 1:
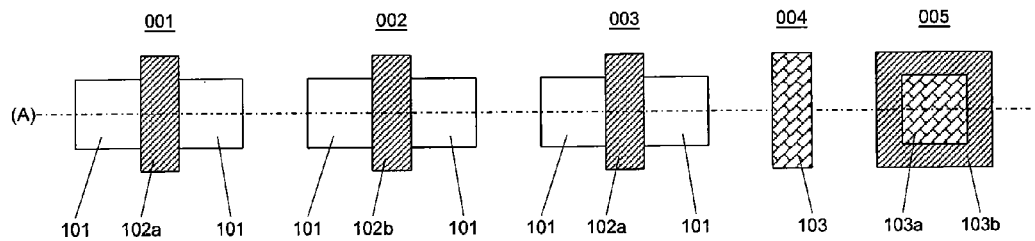
FIG. 1 is a plan view illustrating a structure of a semiconductor circuit device according to the present invention.
Figure 2:
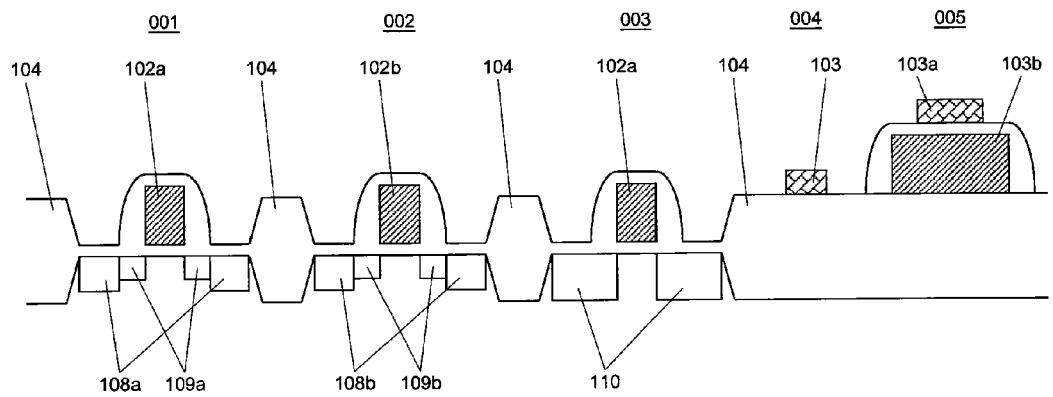
FIG. 2 is a cross-sectional view illustrating the structure of the semiconductor circuit device according to the present invention.
Figure 3:
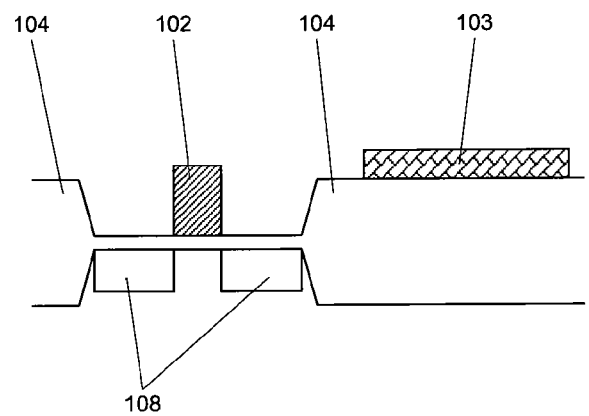
FIG. 3 is a cross-sectional view illustrating an example of a structure of a conventional semiconductor circuit device.
Figure 4:
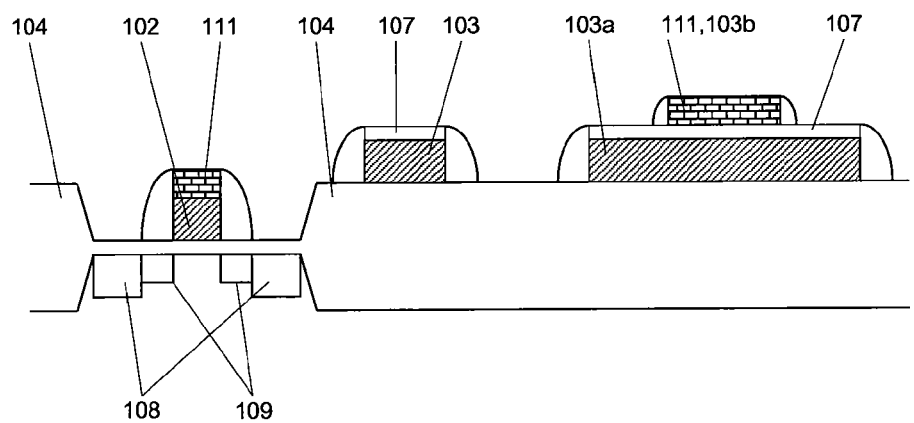
FIG. 4 is a cross-sectional view illustrating another example of a structure of a conventional semiconductor circuit device.
Figure 5:
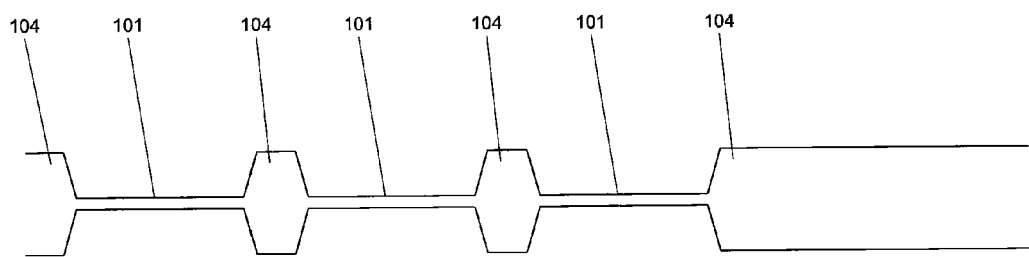
FIG. 5 is a cross-sectional view illustrating a step of a manufacturing process of the semiconductor circuit device according to the present invention.
Figure 6:
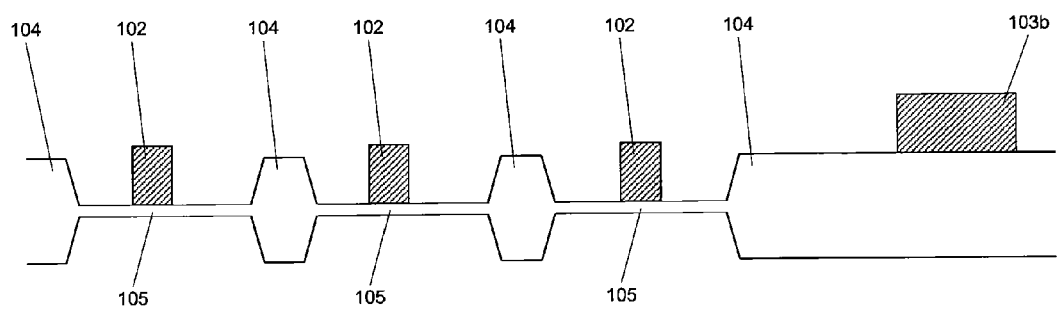
FIG. 6 is a cross-sectional view illustrating a step of the manufacturing process of the semiconductor circuit device according to the present invention.
Figure 7:
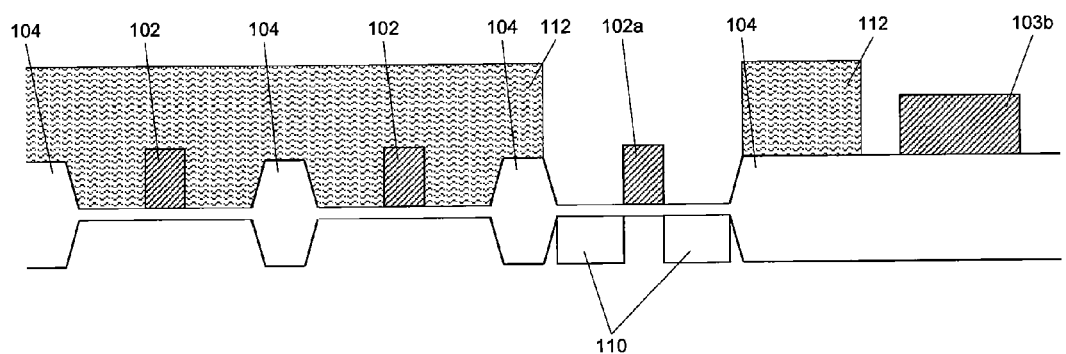
FIG. 7 is a cross-sectional view illustrating a step of the manufacturing process of the semiconductor circuit device according to the present invention.
Figure 8:
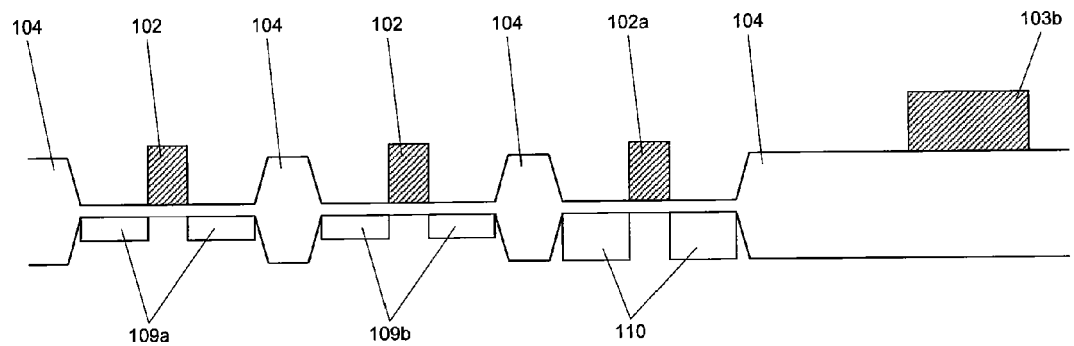
FIG. 8 is a cross-sectional view illustrating a step of the manufacturing process of the semiconductor circuit device according to the present invention.
Figure 9:
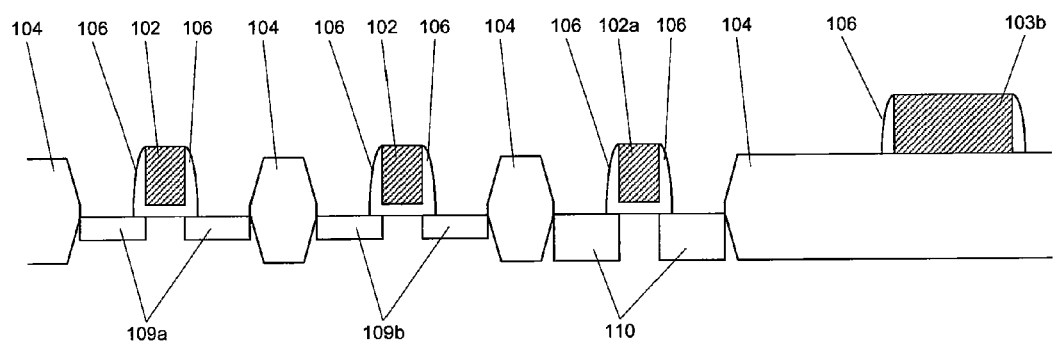
FIG. 9 is a cross-sectional view illustrating a step of the manufacturing process of the semiconductor circuit device according to the present invention.
Figure 10:
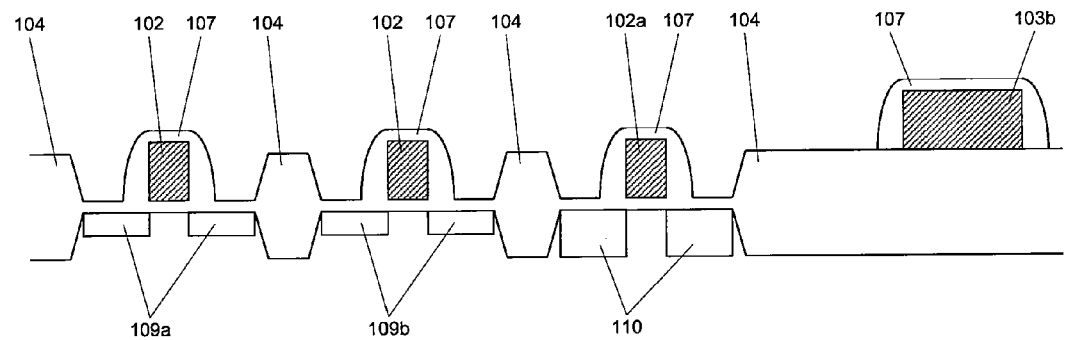
FIG. 10 is a cross-sectional view illustrating a step of the manufacturing process of the semiconductor circuit device according to the present invention.
Figure 11:
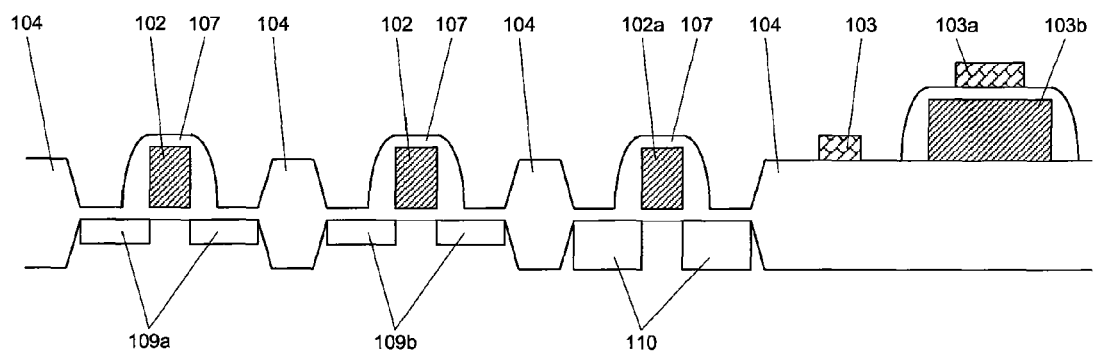
FIG. 11 is a cross-sectional view illustrating a step of the manufacturing process of the semiconductor circuit device according to the present invention.

An embodiment of the present invention is described with reference to the drawings. FIG. 1 is a plan view of a structure of a semiconductor circuit device according to the present invention, and FIG. 2 is a cross-sectional view thereof. The semiconductor circuit device according to the present invention includes an N-type MOS transistor 001, a P-type MOS transistor 002, and a normally-off transistor 003 for electrostatic discharge protection, each formed on an active region 101, and includes a resistor element 004 and a polysilicon capacitor 005, each formed on a LOCOS film 104. The N-type MOS transistor 001 includes an N-type gate electrode 102a formed of a first polysilicon film, N-type S/D regions 108a, and N-type LDD regions 109a. The P-type MOS transistor 002 includes a P-type gate electrode 102b formed of the first polysilicon film, P-type S/D regions 108b, and P-type LDD regions 109b. The normally-off transistor 003 for electrostatic discharge protection includes an N-type gate electrode 102a formed of the first polysilicon film and N-type S/D regions 110. In each of the N-type MOS transistor 001, the P-type MOS transistor 002, and the normally-off transistor 003, side walls 106 are formed on side surfaces of the gate electrode. Further, the resistor element 004 formed on the LOCOS film 104 includes a polysilicon resistor film 103 formed of a second polysilicon film. The polysilicon capacitor 005 includes a lower electrode 103b formed of the first polysilicon film, an upper electrode 103a formed of the second polysilicon film, and a capacitor film 107 sandwiched between the lower electrode 103b and the upper electrode 103a.

FIGS. 5 to 11 are cross-sectional views illustrating steps of a manufacturing process of the semiconductor circuit device according to the present invention.

First, on a surface of a semiconductor substrate, the LOCOS film 104, which is a thick oxide film for element isolation, is selectively formed. A region where the LOCOS film 104 is not formed is a region for forming the MOS transistors or the like, and is called the active region 101. (See FIG. 5.)

The method of forming the LOCOS film is well-known, and is not a gist of the present invention, and hence detailed description thereof is omitted. Further, an N-type well region and a P-type well region are generally formed in the semiconductor substrate, but those are not the gist of the present invention as well, and hence detailed description thereof is also omitted.

Next, an insulating film on the active region is removed, and after a surface of the semiconductor substrate is cleaned, a gate insulating film (105) is formed at a desired thickness. A first polysilicon film 102 is formed on the gate insulating film, and with the use of a photomask, the first polysilicon film 102 is patterned to a desired shape. (See FIG. 6.)

Next, with the use of a photomask, a desired region is opened, and impurity implantation of high concentration phosphorus is performed at a dose of, for example, $5 \times 10^{14}$ ions/cm$^2$ to $2 \times 10^{16}$ ions/cm$^2$, to thereby reduce resistances of the N-type gate electrode 102a and the S/D regions 110 of the normally-off transistor for electrostatic discharge protection, and the first polysilicon film which becomes the lower electrode 103b of the polysilicon capacitor. (See FIG. 7.)

Similarly, with the use of a photomask, in a region where the N-type MOS transistor is to be formed, impurity implantation of phosphorus is performed at a dose of, for example, about $1 \times 10^{12}$ ions/cm$^2$ to $2 \times 10^{14}$ ions/cm$^2$, to thereby form the N-type LDD regions 109a. Further, with the use of a photomask, in a region where the P-type MOS transistor is to be formed, impurity implantation of BF$_2$ is performed at a dose of, for example, about $1 \times 10^{13}$ ions/cm$^2$ to $2 \times 10^{14}$ ions/cm$^2$, to thereby form the P-type LDD regions 109b. (See FIG. 8.)

Next, an oxide film having a thickness of about 1,000 angstroms to 3,000 angstroms is formed on the entire surface, and then anisotropic etching is performed to form the side walls 106 necessary to construct the LDD type MOS transistors. (See FIG. 9.)

Next, the capacitor film 107 is formed to construct the capacitor element. (See FIG. 10.)

Next, the second polysilicon film is formed on the capacitor film, and impurity implantation is performed so as to set the resistance of the resistor element to a desired resistance value. After that, with the use of a photomask, the second polysilicon film is patterned to a desired shape, to thereby form regions becoming the polysilicon resistor film 103 and the upper electrode 103a of the polysilicon capacitor thereafter. (See FIG. 11.)

Next, with the use of a photomask, the gate electrode and the S/D regions of the N-type MOS transistor, the second polysilicon film for the upper electrode of the capacitor element, and a contact region of an N-type resistor element are subjected to selective impurity implantation to form the N-type S/D regions 108a, the N-type polysilicon gate electrode, the N-type upper electrode 103a of the capacitor element, and the N-type contact region (not shown) of the resistor element. Similarly, with the use of a photomask, the gate electrode and the S/D regions of the P-type MOS transistor, and a contact region of a P-type resistor element are subjected to selective impurity implantation to form the P-type S/D regions, the P-type polysilicon gate electrode, and the P-type contact region of the resistor element. The N-type impurity implantation and P-type impurity implantation are each performed at a dose of about $5 \times 10^{14}$ ions/cm$^2$ to $2 \times 10^{16}$ ions/cm$^2$. After the both impurity implantations, thermal treatment for impurity activation is performed to reduce the resistance. In this manner, a desired N-type MOS transistor, P-type MOS transistor, normally-off transistor for electrostatic discharge protection, resistor element, and capacitor element are obtained. (See FIG. 2.)

After that, an interlayer insulating film is formed, and then a contact and metal wiring are formed. Thus, the semiconductor circuit device is completed. Detailed description of steps after forming the interlayer insulating film is omitted because the description departs from the gist of the present invention.

(First Embodiment)

When a high resistance, high precision resistor element is unnecessary, the resistor element can be formed of the first polysilicon film.

In order to form a resistor element having higher resistance and higher precision, the resistor element is formed of the second polysilicon film, and the thickness of the second polysilicon film is formed thinner than that of the first polysilicon film. Specifically, the first polysilicon film is generally formed to be about 2,000 angstroms to 4,000 angstroms. Therefore, the second polysilicon film is formed thinner to be about 200 angstroms to 2,000 angstroms.

Polysilicon has, as the name suggests, a polycrystalline structure, and hence when the impurity concentration per unit volume is low, fluctuation caused by manufacturing in resistance value thereof tends to become notably large. High impurity concentration per unit volume may prevent the fluctuation though, the resistance value becomes low. Considering this point, high impurity concentration per unit volume can be obtained by forming a thin polysilicon film, permitting a good balance between suppression of the fluctuation in resistance value and the high resistance.

Further, the surface of the first polysilicon film is only slightly removed when the side walls are formed. This makes a cause of the resistance fluctuation of the first polysilicon film. When the second polysilicon film is used as the resistor element, because the second polysilicon film is not subjected to a process in which the surface is removed as described above, it is possible to obtain a resistor element with higher precision compared with the case of using the first polysilicon film.

When a high resistance resistor element and a low resistance resistor element are both necessary within the same chip, the low resistance resistor element is formed of the first polysilicon film, and the high resistance resistor element is formed of the second polysilicon film.

(Second Embodiment)

In the manufacturing method described above, the LDD regions are formed by impurity implantation for LDD region formation. However, instead of performing this impurity implantation, the MOS transistor may be formed by using regions in which high concentration impurities, which are implanted into the S/D regions, are thermally diffused, as high resistance regions, in other words, LDD regions.

(Third Embodiment)

In the manufacturing method described above, there is included a step of forming side walls for LDD region formation, but even if side walls are not used, by using, for example, a photomask, it is possible to form high resistance regions for the LDD type MOS transistor. However, when the photomask is used, the length of each of the LDD regions, that is, the high resistance regions is changed by the influence of the displacement of the mask, and hence the characteristics of the MOS transistor are deteriorated. In contrast, there is a merit that the step of forming side walls can be reduced. Anyway, it is possible to form the MOS transistor without the step of forming side walls.

(Fourth Embodiment)

In the manufacturing method described above, after impurity implantation for formation of the N-type S/D regions of the normally-off transistor for electrostatic discharge protection is performed, and before high concentration P-type impurity implantation for the P-type MOS transistor is performed, thermal treatment is performed.

Diffusion occurs in the N-type S/D regions of the normally-off transistor for electrostatic discharge protection by heat. As described above, electrostatic discharge protection capability depends on the volume of the heat generating region. Therefore, if the N-type S/D regions of the normally-off transistor diffuse deep in the semiconductor substrate, only small area is necessary to obtain the same electrostatic discharge protection capability. With this, it is possible to reduce the size of the normally-off transistor. Further, by the diffusion, it is also possible to increase the withstand voltage of the drain. If thermal treatment is performed after the impurity implantation for the LDD regions, the LDD regions are thermally diffused, and hence it is possible to increase the withstand voltage of the drain of the LDD type MOS transistor. If thermal treatment is performed after the formation of the capacitor film, it is possible to improve the characteristics of the capacitor film.

In the thermal treatment performed after the high concentration P-type impurity implantation for the P-type MOS transistor, there may be observed a phenomenon that boron which is generally used as P-type impurities passes through the gate oxide film to reach the semiconductor substrate. This causes variation in threshold value, which is an important characteristic of the MOS transistor. Therefore, after the step of performing high concentration P-type impurity implantation, thermal treatment can only be performed at a temperature which is equal to or lower than a temperature which does not allow boron to reach the semiconductor substrate. Therefore, the temperature is generally about 850° C. at most. Further, if rapid thermal treatment, such as rapid thermal annealing (RTA) or lamp annealing, is performed instead of gradual thermal treatment performed in a conventional furnace, the temperature may be set a little higher. However, in view of thermal history considered from the temperature and the time period, it is only possible to perform the thermal treatment to a similar extent. Therefore, in many cases, even though application of heat is required, application of heat cannot be performed because of the problem of the passing through of boron in the P-type MOS transistor.

In a case where thermal treatment is performed at a temperature equal to or higher than a temperature which allows boron to pass through the gate oxide film, the thermal treatment is required to be performed before the step of implanting high concentration P-type impurities into the gate electrode. However, in the manufacturing method according to the present invention, the corresponding high concentration impurity implantation is performed at the last high concentration impurity implantation, and hence it is possible to perform the thermal treatment relatively freely.

(Fifth Embodiment)

The gate electrode of the N-type MOS transistor may be subjected to high concentration P-type impurity implantation, to thereby form a P-type gate electrode. At this time, the threshold value becomes high due to the work function difference, but the MOS transistor can be used without problems as the N-type MOS transistor. All of the MOS transistors within the same chip may be formed as described above. Alternatively, a part of the MOS transistors may include the MOS transistor formed as describe above, and the N-type MOS transistor with the N-type gate and the N-type MOS transistor with the P-type gate may be mixed within the same chip.

Similarly, the P-type MOS transistor may be formed to include an N-type gate electrode.

(Sixth Embodiment)

The S/D regions and the gate electrode of the normally-off transistor for electrostatic discharge protection may be subjected to the high concentration N-type impurity implantation for the N-type MOS transistor. With this, resistance in the S/D regions of the normally-off transistor for electrostatic discharge protection may be further reduced, and it is possible to suppress local heat generation. That is, it is possible to further reduce the area occupied by the normally-off transistor.

What is claimed is:

1. A method of manufacturing a semiconductor circuit device including an NMOS and a PMOS transistor, an EDS protection device, and a capacitor element, the method comprising:

selectively forming a LOCOS film on a semiconductor substrate to form an active region;

forming a gate insulating film on a surface of the active region;

forming a first polysilicon film on the gate insulating film and the LOCOS film;

patterning the first polysilicon film to form a lower electrode of the capacitor element and gate electrodes of the NMOS transistor, the PMOS transistor, and a gate electrode of the ESD protection device;

after forming the lower electrode and the gate electrodes, implanting high concentration N-type impurities into a region for the ESD protection device which is not of an LDD type and the lower electrode of the capacitor element at a dose of $5 \times 10^{14}$ ions/cm$^2$ to $2 \times 10^{16}$ ions/cm$^2$, wherein the gate electrode of the ESD protection device comprises a first resistance element having a first electrical resistance and the upper electrode of the capacitor element comprises a second resistance element having a second electrical resistance that is higher than the first electrical resistance;

implanting N-type impurities into a region for the NMOS transistor which is of an LDD type to form N-type LDD regions, and implanting P-type impurities into a region for the PMOS transistor which is of the LDD type to form P-type LDD regions;

forming a capacitor film;

forming a second polysilicon film on the capacitor film;

patterning the second polysilicon film to form an upper electrode of the capacitor element and a resistor element;

implanting N-type impurities at a dose of $5 \times 10^{14}$ ions/cm$^2$ to $2 \times 10^{16}$ ions/cm$^2$ to form N-type source and drain regions, an N-type polysilicon gate electrode, an N-type upper electrode of the capacitor, and an N-type contact region; and implanting P-type impurities at a dose of $5 \times 10^{14}$ ions/cm$^2$ to $2 \times 10^{16}$ ions/cm$^2$ to form P-type source and drain regions, a P-type polysilicon gate electrode, an P-type upper electrode of the capacitor, and a P-type contact region.

2. A method of manufacturing a semiconductor circuit device according to claim 1, further comprising forming side walls after the implanting N-type impurities to form the N-type LDD regions and the implanting P-type impurities to form the P-type LDD regions.

3. A method of manufacturing a semiconductor circuit device according to claim 1, wherein the second polysilicon film is formed thinner than the first polysilicon film.

4. A method of manufacturing a semiconductor circuit device according to claim 1, wherein the second resistance element has a contact region which is different in impurity concentration with respect to the first resistance element.

5. A method of manufacturing a semiconductor circuit device according to claim 1, wherein the MOS transistor which is of the LDD type is formed without side walls, and a length of LDD regions is determined by a photomask.

6. A method of manufacturing a semiconductor circuit device according to claim 1, further comprising performing thermal treatment between the implanting high concentration N-type impurities at a dose of $5 \times 10^{14}$ ions/cm$^2$ to $2 \times 10^{16}$ ions/cm$^2$ and the implanting high concentration P-type impurities at a dose of $5 \times 10^{14}$ ions/cm$^2$ to $2 \times 10^{16}$ ions/cm$^2$.

* * * * *